(12) United States Patent
Xu

(10) Patent No.: US 12,282,154 B2
(45) Date of Patent: Apr. 22, 2025

(54) GALVANOMETER MOTOR APPARATUS

(71) Applicant: Peijian Xu, Guangzhou (CN)

(72) Inventor: Peijian Xu, Guangzhou (CN)

( * ) Notice: Subject to any disclaimer, the term of this patent is extended or adjusted under 35 U.S.C. 154(b) by 854 days.

(21) Appl. No.: 17/451,650

(22) Filed: Oct. 21, 2021

(65) Prior Publication Data

US 2022/0137399 A1    May 5, 2022

(30) Foreign Application Priority Data

Sep. 3, 2021    (CN) .......................... 202111033959.1

(51) Int. Cl.
| | |
|---|---|
| *G01R 5/16* | (2006.01) |
| *B23K 26/06* | (2014.01) |
| *G02B 26/10* | (2006.01) |
| *H02K 5/16* | (2006.01) |
| *H02K 21/20* | (2006.01) |
| *H02K 26/00* | (2006.01) |

(52) U.S. Cl.
CPC .......... *G02B 26/10* (2013.01); *B23K 26/0648* (2013.01); *G01R 5/16* (2013.01); *H02K 5/161* (2013.01); *H02K 21/20* (2013.01); *H02K 26/00* (2013.01)

(58) Field of Classification Search
CPC ..... G01R 5/04–5/06; G01R 5/14–5/16; H02K 1/12; H02K 26/00
See application file for complete search history.

(56) References Cited

U.S. PATENT DOCUMENTS

| | | | |
|---|---|---|---|
| 6,320,285 B1 * | 11/2001 | Ito .......................... | H02K 26/00 |
| | | | 310/36 |
| 2003/0063357 A1 | 4/2003 | Maruyama et al. | |
| 2003/0075769 A1 | 4/2003 | Brown et al. | |
| 2004/0041492 A1* | 3/2004 | Ishikawa ................ | H02K 1/143 |
| | | | 310/419 |
| 2012/0170426 A1* | 7/2012 | Honmura ................ | H02K 37/14 |
| | | | 368/76 |
| 2018/0272474 A1 | 9/2018 | Murakami et al. | |

FOREIGN PATENT DOCUMENTS

JP    4646607 B2 *    3/2011

* cited by examiner

*Primary Examiner* — Ramon M Barrera
(74) *Attorney, Agent, or Firm* — Nitin Kaushik

(57) ABSTRACT

Disclosed is a galvanometer motor apparatus. The galvanometer motor apparatus includes a housing, a stator assembly, and a rotor assembly, wherein the rotor assembly includes an axle and a magnet that are coaxially arranged, and the stator assembly includes a frame and a single electromagnetic coil wound on the frame; wherein a first through hole configured to allow the magnet to rotatably run through is molded on the frame, the electromagnetic coil is disposed on a side of the first through hole, the electromagnetic coil is excitable to generate a drive magnetic field to magnetize the frame to supply a torque to the magnet, a recess configured to receive the stator assembly is molded in the housing. With such configurations, structure design is optimized, assembling is simpler, and efficiency is higher.

11 Claims, 5 Drawing Sheets

GALVANOMETER MOTOR APPARATUS

TECHNICAL FIELD

The present disclosure relates to the technical field of galvanometers, and in particular, relates to a galvanometer motor apparatus.

BACKGROUND

A galvanometer system is a high-precision and high-speed servo control system constituted by a drive plate and a high-speed swing motor, which is widely applied in the fields such as laser material machining, biomedical detection, and image and graphics processing. The core component of a high-speed scanning galvanometer system is a galvanometer motor. A high-efficiency and high-quality galvanometer motor is capable of implementing high-speed laser marking.

In one conventional galvanometer, a motor housing of the galvanometer is made of iron, and two arc-shaped coils are mounted in a frameless and sensorless fashion inside the galvanometer. Another galvanometer motor is a sensored motor using a laminate of silicon steel sheets as a coil frame as disclosed in Patent Application No. CN 103051075 A. Such motors all include a front bearing mounting seat, a rear bearing mounting seat, and a coil frame having a silicon steel sheet laminated structure sandwiched between the two seat. This structure has the following defects: (1) The motor apparatus includes too many parts; (2) the assembling complexity is high; (3) since the core is fixed to the housing using an epoxy resin, the subsequent assembling operations may be performed in the case that the adhesive is cured, which affects the assembling efficiency; (4) the assembling, disassembling and maintenance are complex and involve too many operations, and the motor apparatus may be disassembled by heating the epoxy resin, and thus non-destructive disassembling is hard; and (5) the motor apparatus is compact in terms of space, and one type of motor corresponds to one winding parameter, which is irreplaceable.

SUMMARY

To overcome the defects in the related art, the present disclosure provides a galvanometer motor apparatus.

To achieve the above object, the present disclosure employs a technical solution of a galvanometer motor apparatus. The galvanometer motor apparatus includes a housing, a stator assembly, and a rotor assembly, wherein the rotor assembly includes an axle and a magnet that are coaxially arranged, and the stator assembly includes a frame and a single electromagnetic coil wound on the frame; wherein a first through hole configured to allow the magnet to rotatably run through is molded on the frame, the electromagnetic coil is disposed on a side of the first through hole, the electromagnetic coil is excitable to generate a drive magnetic field to magnetize the frame to supply a torque to the magnet, a recess configured to receive the stator assembly is molded in the housing, a second through hole arranged coaxially with the first through hole and extending to run through the recess is molded on the housing, and the axle rotatably runs through the second through hole.

Further, a support portion disposed on the side of the first through hole and extending along an axial direction perpendicular to the first through hole is molded on the frame, and the electromagnetic coil is wound on the support portion.

Further, a protrusive restraining block is molded on both sides of an outer wall of the support portion on the frame; wherein a distance between the support portion and either of the two restraining blocks is a maximum width for winding the electromagnetic coil, and a protrusion height of the restraining block is greater than a winding radius of the electromagnetic coil.

Further, a shape of the frame mates with a shape of the recess.

Further, the housing is connected to the frame via at least one locking screw.

Further, the housing includes an integrally molded front bearing seat, a rear bearing seat, and a connection bridge; wherein two ends of the connection bridge are respectively integrally connected to end portions of the front bearing seat and the rear bearing seat, and a cut-out region enclosed by the connection bridge, the front bearing seat, and the rear bearing seat serves as the recess.

Further, the housing includes a front bearing seat, a rear bearing seat, and a connection bridge that are discrete from each other; wherein a section of the connection bridge is an inverted U-shaped structure, the front bearing seat and the rear bearing seat are respectively embedded at a front end and a rear end inside a U-shaped recess of the connection bridge, and a cut-out region enclosed by the connection bridge, the front bearing seat, and the rear bearing seat that are assembled serves as the recess.

Further, the galvanometer motor apparatus includes two second through holes; wherein the two second through holes are respectively molded on the front bearing seat and the rear bearing seat.

Further, one end of the axle extends to the outside of the front end face of the housing and is connected to a prearranged lens.

Further, the galvanometer motor apparatus further includes a wiring board arranged on a rear end face of the housing.

The present disclosure achieves the following beneficial effects: (1) the volume of the motor apparatus is greatly reduced such that the scanning angle of the reflection laser of the lens is increased; (2) the structure design is optimized, the assembling is simpler, and the efficiency is higher; and (3) the disassembling is convenient, and replacement and repair are made according to the actual needs.

BRIEF DESCRIPTION OF THE DRAWINGS

For clearer descriptions of the technical solutions in the embodiments of the present disclosure or in the related art, hereinafter, drawings that are to be referred for description of the embodiments or the related art are briefly described. Apparently, the drawings described hereinafter merely illustrate some embodiments of the present disclosure. Persons of ordinary skill in the art may also derive other drawings based on the drawings described herein without any creative effort.

Figure 1:
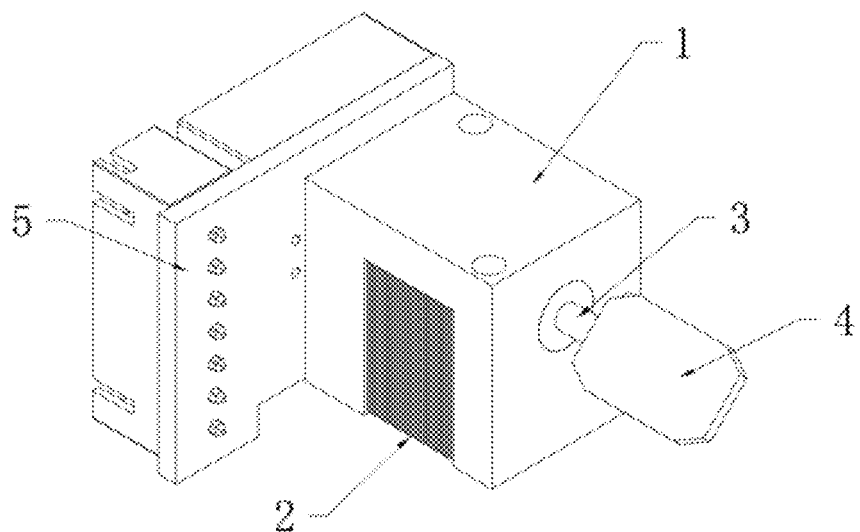
FIG. 1 is a schematic structural view of a motor apparatus according to a first embodiment.
Figure 2:
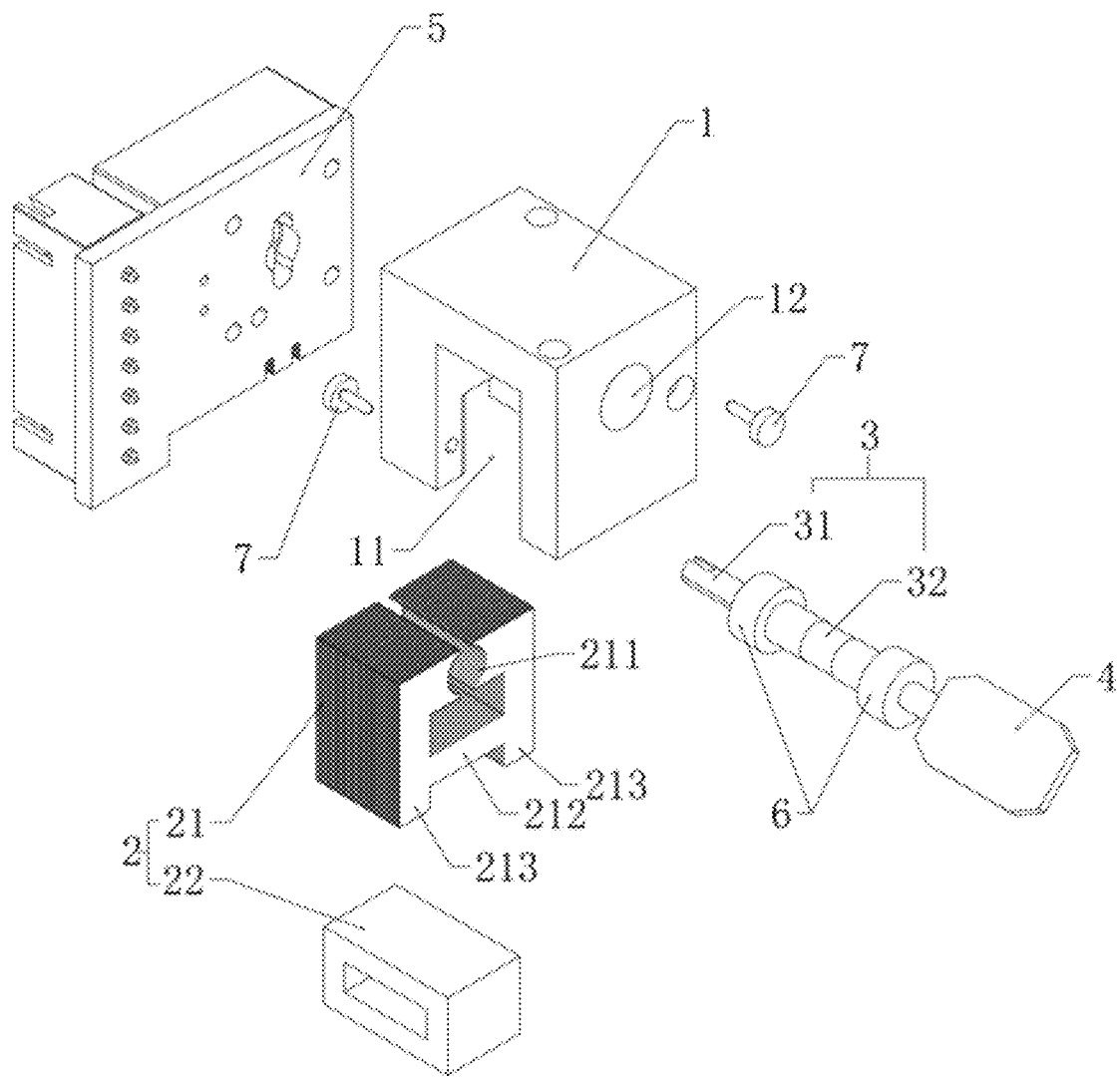
FIG. 2 is a schematic exploded view of the motor apparatus according to the first embodiment.
Figure 3:
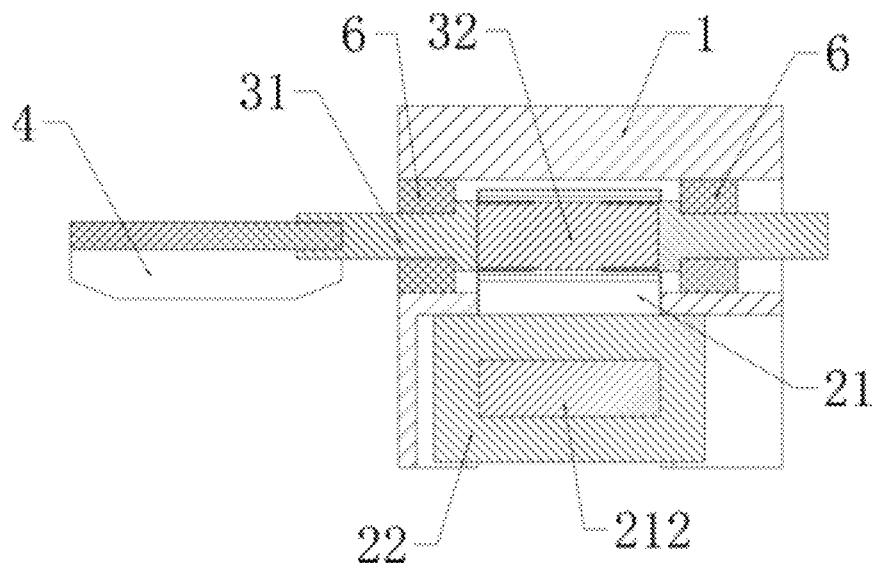
FIGS. 3 and 4 are overall sectional views of the motor apparatus according to the first embodiment.
Figure 4:
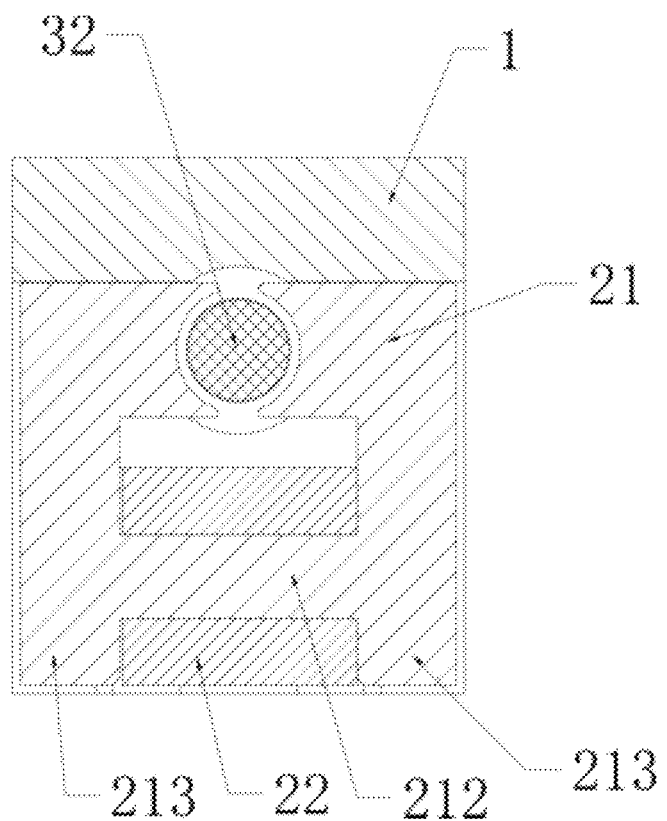
Figure 5:
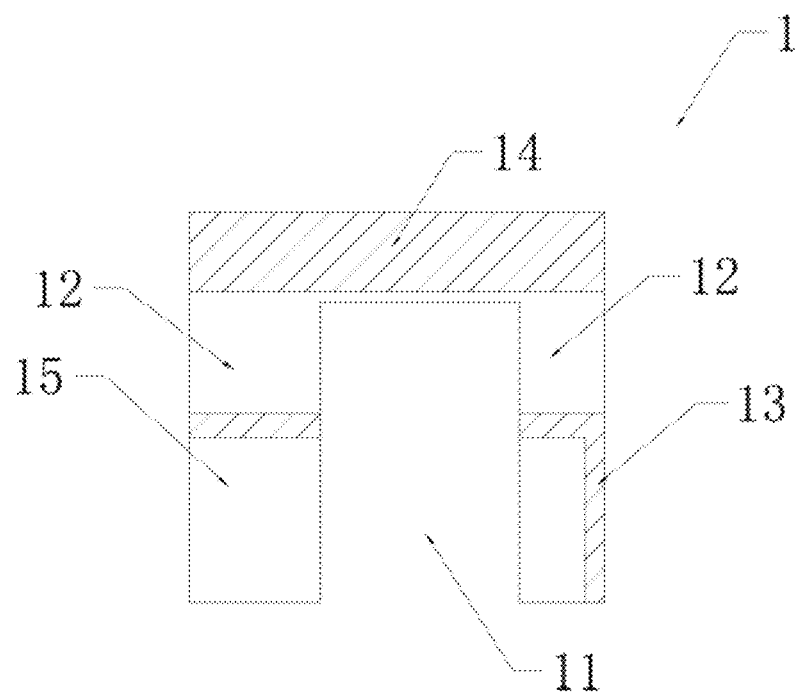
FIG. 5 is a sectional view of a housing according to the first embodiment.
Figure 6:
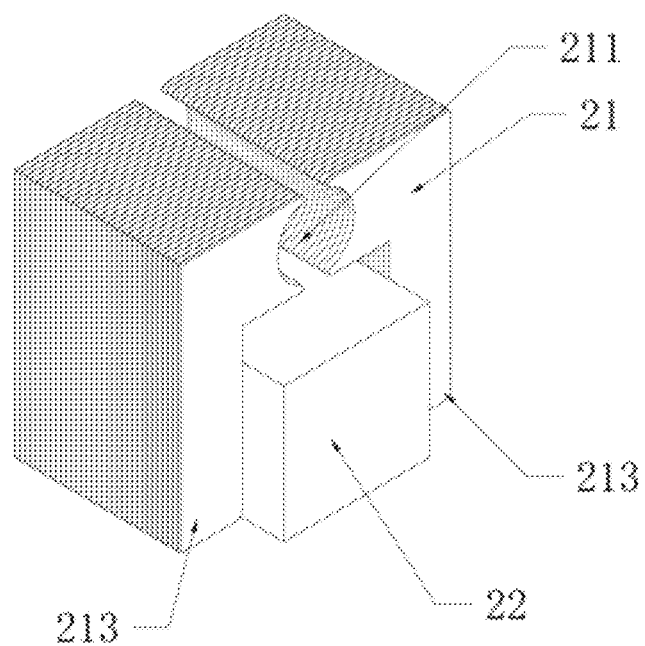
FIG. 6 is a schematic structural view of a stator assembly according to the first embodiment.
Figure 7:
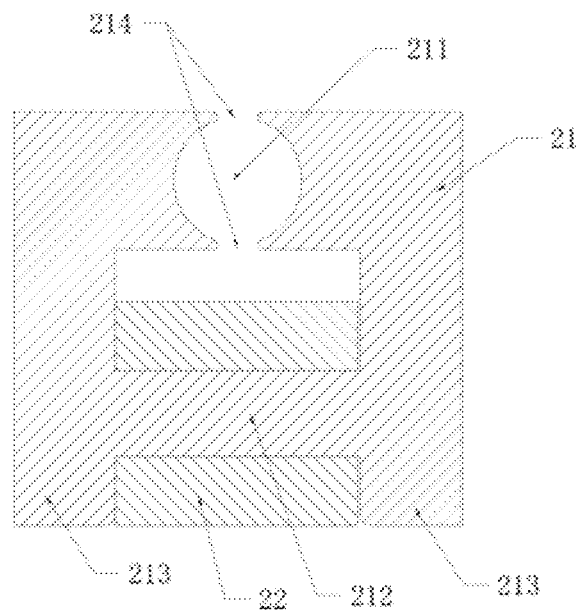
FIG. 7 is a sectional view of the stator assembly according to the first embodiment.

Reference numerals and denotations thereof: 1—housing, 11—recess, 12—second through hole, 13—front bearing seat, 15—rear bearing seat, 14—connection bridge, 2—stator assembly, 21—frame, 211—first through hole, 212—support portion, 213—restraining block, 214—separation gap, 22—electromagnetic coil, 3—rotor assembly, 31—axle, 32—magnet, 4—lens, 5—wiring board, 6—rotary bearing, and 7—locking screw.

DETAILED DESCRIPTION

The technical solutions in the embodiments of the present disclosure are described in detail clearly and completely hereinafter with reference to the accompanying drawings for the embodiments of the present disclosure. Apparently, the described embodiments are only a portion of embodiments of the present disclosure, but not all the embodiments of the present disclosure. Based on the embodiments of the present disclosure, all other embodiments derived by persons of ordinary skill in the art without any creative efforts shall fall within the protection scope of the present disclosure.

In the description of the present disclosure, it should be understood that the terms "center," "upper," "lower," "left,", "right," "vertical," "horizontal," "inner," "outer," and the like indicate orientations and position relationships which are based on the illustrations in the accompanying drawings, and these terms are merely for ease and brevity of the description, instead of indicating or implying that the devices or elements shall have a particular orientation and shall be structured and operated based on the particular orientation. Accordingly, these terms shall not be construed as limiting the present disclosure. In addition, the terms "first," "second," and "third" are merely for the illustration purpose, and shall not be construed as indicating or implying a relative importance. In the description of the embodiments of the present disclosure, it should be noted that unless otherwise specified and defined, the terms "mounted," "coupled," "connected," and derivative forms thereof shall be understood in a broad sense, which, for example, may be understood as fixed connection, detachable connection or integral connection; may be understood as mechanical connection or electrical connection, or understood as direct connection, indirect connection via an intermediate medium, or communication between the interiors of two elements or interactions between two elements. Persons of ordinary skill in the art may understand the specific meanings of the above terms in the present invention according to the actual circumstances and contexts.

First Embodiment

Referring to FIG. 1 to FIG. 7, in this embodiment, a galvanometer motor apparatus includes a housing 1, a stator assembly 2, and a rotor assembly 3. The rotor assembly 3 includes an axle 31 and a magnet 32 that are coaxially arranged. The magnet 32 may be a solid cylindrical magnet 32, and have a single N pole and a single S pole that are oppositely arranged in a radial direction. Second, the magnet 32 may be coaxially sleeved on the axle 31, or two parts divided from the axle 31 are respectively coaxially connected to two ends of the magnet 32, which is not limited herein. A person skilled in the art may employ a suitable or a derived technical scheme.

In this embodiment, the stator assembly 2 includes a frame 21 and a single electromagnetic coil 22, wherein the frame 21 is formed by lamination of a plurality of silicon steel sheets. A first through hole 211 extending along the direction of the laminated silicon steel sheets is molded on the frame 21, and the first through hole 211 is configured for rotatable plug-in fitting of the magnet 32. A support portion 212 disposed on the side of the first through hole 211 and extending along an axial direction perpendicular to the first through hole 211 is molded on the frame 21, and the electromagnetic coil 22 is wound on the support portion 212, such that the electromagnetic coil 22 is wound on the frame 21, and the electromagnetic coil 22 is excitable to generate a drive magnetic field to magnetize the frame 21 to supply a torque to the magnet 32. By using the single electromagnetic coil 22 as described above, the volume of the frame 21 may be reduced, which facilitates reduction of the volume of the motor apparatus.

Specifically, in the case that a forward current is applied to the electromagnetic coil 22, a clockwise torque is generated to drive the magnetic 32 to rotate clockwise; on the contrary, in the case that a reverse current is applied to the electromagnetic coil 22, a counterclockwise torque is generated to drive the magnetic 32 to rotate counterclockwise. The torque is generated proportionally to the magnitude of the current applied to the electromagnetic coil 22.

Further, the electromagnetic coil 22 according to this embodiment is wound on the support portion 212 in an in-advance separative winding fashion, which facilitates the manufacture.

In this embodiment, two separation gaps 214 extending to run through the frame 21 are molded on an inner wall of the first through hole 211. The two separation gaps are face-to-face arranged on the inner wall of the first through hole along a direction perpendicular to a lengthwise direction of the support portion.

In this embodiment, the housing 1 includes a front bearing seat 13, a rear bearing seat 15, and a connection bridge 14 that are integrally molded. Two ends of the connection bridge 14 are respectively integrally connected to upper end portions of the front bearing seat 13 and the rear bearing seat 15. In this case, the front bearing seat 13, the connection bridge 14, and the rear bearing seat 15 define a U-shaped structure. A cut-out region enclosed by the front bearing seat 13, the connection bridge 14, and the rear bearing seat (15) defines a recess 11. That is, a recess 11 configured to receive the stator assembly 2 is molded in the housing 1. In this case, the recess 11 has openings in three faces relative to the housing 1, and the frame 21 and coils of the stator assembly 2 may be placed into the recess via any of the three openings. Second, the shape of the frame 21 mates with the shape of the recess 11, such that an outer surface of the frame 21 placed into the recess 11 is correspondingly flush with outer surfaces of the front bearing seat 13, the connection bridge 14, and the rear bearing seat 15. In this case, the frame 21 is capable of being more compactly assembled into the recess 11, such that the assembling accuracy is effectively improved, the assembling complexity is lowered, and extra slits are prevented and entry of dusts is prevented.

In this embodiment, a protrusive restraining block 213 is molded on both sides of an outer wall of the support portion 212 on the frame 21; wherein a distance between the support portion 212 and either of the two restraining blocks 213 is a maximum width for winding the electromagnetic coil 22, and a protrusion height of the restraining block 213 is greater than a winding radius of the electromagnetic coil 22. In this way, a winding width and the winding radius of the electromagnetic coil 22 are restricted by using the two restraining blocks 213, such that the electromagnetic coil 22 is more regularly arranged without spillage.

Further, outer side arms of the restraining blocks 213 are flush with the outer surface of the frame 21, and outer end faces of the restraining blocks 213 are flush with lower end faces of the front bearing seat 13 and the rear bearing seat 15, such that the frame 21 is capable of being more closely mated and integral with the housing 1.

The deployment structure of the electromagnetic coil 22 is improved by using the frame 21 and the structure of the restraining blocks 213, such that the volume of the motor apparatus is further reduced on the premise of providing a sufficient torque, and hence a scanning angle of laser reflected by a lens 4 is increased.

In this embodiment, a second through hole 12 arranged coaxially with the first through hole 211 and extending to run through the recess 11 is molded on the housing 1. In this embodiment, two second through holes 12 are arranged. The two second through holes 12 are respectively molded in the front bearing seat 13 and the rear bearing seat 15. A rotary bearing 6 allowing the axle 31 to rotatably run through is arranged in the second through hole 12. That is, two ends of the axle 31 respectively run through the second through holes 12 in the front bearing seat 13 and the rear bearing seat 15. The end of the axle 31 running through the front bearing seat 13 is connected to the lens 4 configured to reflect laser. That is, one end of the axle 31 extends to the outside of a front end face of the housing 1 and is connected to the lens 4.

In this embodiment, the frame 21 and the housing 1 are connected via two fixing screws. Specifically, a screw hole mating with the fixing screw is opened in both the front bearing seat 13 and the rear bearing seat 15 of the housing 1. The two fixing screws respectively run through, in a front-rear direction, the screw holes in the front bearing seat 13 and the rear bearing seat 15, and are connected to the frame 21, such that the frame 21 and the housing 1 are fixedly connected.

For ease of understanding, the motor apparatus is further illustrated with reference to the specific assembling fashion.

During the assembling, first, the frame 21 on which the electromagnetic coil 22 is pre-wound is mounted into the recess 11 of the housing 1; then, the position of the frame 21 in the groove 11 is adjusted to ensure that various surfaces of the frame 21 are respectively flush with the outer surfaces of the front bearing seat 13, the connection bridge 14, and the rear bearing seat 15, such that the first through hole 211 and the second through hole 12 are coaxially aligned; subsequently, the axle 31 and the magnet 32 of the rotor assembly 3 are mounted into the second through hole 12 and the first through hole 211; and finally, two fixing screws respectively run through the front bearing seat 13 and the rear bearing seat 15 of the housing 1 in a front-rear direction, and are then connected to the frame 21. In this way, the assembling of the motor apparatus is completed. In this way, the assembling complexity of the motor apparatus is low and the mounting operations are simple, the assembling time and calibration time are greatly reduced, and manpower cost for the assembling is lowered.

In this embodiment, during replacement or repair of any part of the motor apparatus, the motor apparatus needs to be disassembled first. The disassembling process is as follows: First, the axle 31 and the magnet 32 of the rotor assembly 3 are pulled out, then the two fixing screws are loosened and removed, and finally, the frame 21 with the electromagnetic coil 22 is removed from the housing 1. In this way, the disassembling of the motor apparatus is completed. In this case, the parts need to be replaced may be replaced. In the case that the frame 21 or the electromagnetic coil 22 needs to be replaced, a new frame 21 (a new electromagnetic coil 22 is pre-wound on the new frame 21) may be directly employed and mounted onto the housing 1; in the case that the housing 1 needs to be replaced, a new housing may be directly employed for assembling of the original frame 21. If the axle 31 and the magnet 32 of the rotor assembly 3 need to be replaced, a new rotor assembly 3 is mounted onto the housing 1 and the frame 21. In addition, in actual operations, the rotor assembly 3 may be replaced without completely disassembling the motor apparatus, and a new rotor assembly 3 may be employed in the case that the original rotor assembly 3 is disassembled. By using the above disassembling and replacement fashions, the disassembling is simple and quick, and non-destructive replacement of the parts are achieved, such that modularized disassembling is achieved, and hence the maintenance cost is greatly reduced.

In this embodiment, the galvanometer motor apparatus further includes a wiring board 5 arranged on a rear end face of the housing 1.

Second Embodiment

Figure 8:
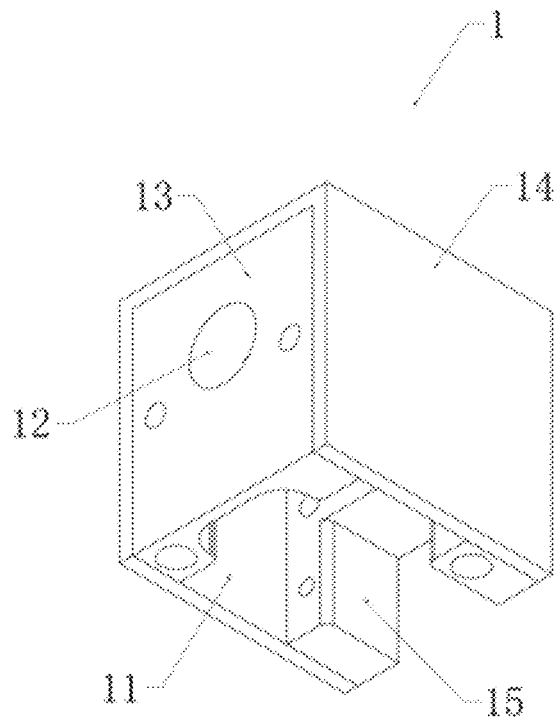
FIG. 8 is a schematic structural view of the housing according to the second embodiment.
Figure 9:
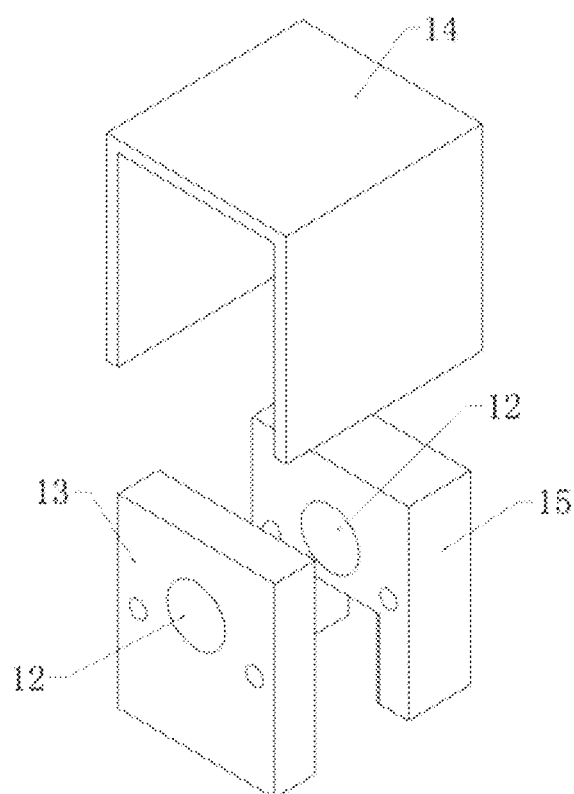
FIG. 9 is a schematic exploded view of the housing according to the second embodiment.

As illustrated in FIG. 8 and FIG. 9, different from the first embodiment, in this embodiment, the housing 1 employs a discrete structure in terms of assembling. Specifically, the housing 1 includes a front bearing seat 13, a connection bridge 14, and a rear bearing seat 15 that are discrete from each other, wherein the connection bridge 14 is an inverted U-shaped structure, and the front bearing seat 13 and the rear bearing seat 15 are respectively embedded at a front end and a rear end inside a U-shaped recess of the connection bridge 14. At this time, the connection bridge wraps and covers both sides and top surfaces of the front bearing seat 13 and the rear bearing seat 15. In this way, a cut-out region enclosed by the front bearing seat 13, the connection bridge 14, and the rear bearing seat 15 that are assembled serves as the recess 11.

Further, the connection bridge 14, the front bearing seat 13, and the rear bearing seat 15 are assembled in a fixed fashion such as welding, screws, adhesion, or the like, which is not limited herein.

Similarly, the second through hole 12 as described in the second embodiment are respectively molded in the front bearing seat 13 and the rear bearing seat 15.

The above embodiments are used only for illustrating the present disclosure, but are not intended to limit the protection scope of the present disclosure. Various modifications and replacements readily derived by those skilled in the art within technical disclosure of the present disclosure shall fall within the protection scope of the present disclosure. Therefore, the protection scope of the present disclosure is subject to the claims.

The invention claimed is:

1. A galvanometer motor apparatus, comprising: a housing (1), a stator assembly (2), and a rotor assembly (3), wherein the rotor assembly (3) comprises an axle (31) and a magnet (32) that are coaxially arranged, and the stator assembly (2) comprises a frame (21) and a single electromagnetic coil (22) wound on the frame (21); wherein a first through hole (211) configured to allow the magnet (32) to rotatably run through is molded on the frame (21), the electromagnetic coil (22) is disposed on a side of the first through hole (211), the electromagnetic coil (22) is excitable to generate a drive magnetic field to magnetize the frame (21) to supply a torque to the magnet (32), a recess (11) configured to receive the stator assembly (2) is molded in the housing (1), a second through hole (12) arranged coaxially with the first through hole (211) and extending to run through the recess (11) is molded on the housing (1), and the axle (31) rotatably runs through the second through hole (12).

2. The galvanometer motor apparatus according to claim 1, wherein a support portion (212) disposed on the side of the first through hole (211) and extending along an axial direction perpendicular to the first through hole (211) is molded on the frame (21), and the electromagnetic coil (22) is wound on the support portion (212).

3. The galvanometer motor apparatus according to claim 2, wherein a protrusive restraining block (213) is molded on both sides of an outer wall of the support portion (212) on the frame (21); wherein a distance between the support portion (212) and either of the two restraining blocks (213) is a maximum width for winding the electromagnetic coil (22), and a protrusion height of the restraining block (213) is greater than a winding radius of the electromagnetic coil (22).

4. The galvanometer motor apparatus according to claim 1, wherein a shape of the frame (21) mates with a shape of the recess (11).

5. The galvanometer motor apparatus according to claim 1, wherein the housing (1) is connected to the frame (21) via at least one locking screw (7).

6. The galvanometer motor apparatus according to claim 1, wherein the housing (1) comprises an integrally molded front bearing seat (13), a rear bearing seat (15), and a connection bridge (14); wherein two ends of the connection bridge (14) are respectively integrally connected to end portions of the front bearing seat (13) and the rear bearing seat (15), and a cut-out region enclosed by the connection bridge (14), the front bearing seat (13), and the rear bearing seat (15) serves as the recess (11).

7. The galvanometer motor apparatus according to claim 1, wherein the housing (1) comprises a front bearing seat (13), a rear bearing seat (15), and a connection bridge (14) that are discrete from each other; wherein a section of the connection bridge (14) is an inverted U-shaped structure, the front bearing seat (13) and the rear bearing seat (15) are respectively embedded at a front end and a rear end inside a U-shaped recess of the connection bridge (14), and a cut-out region enclosed by the connection bridge (14), the front bearing seat (13), and the rear bearing seat (15) that are assembled serves as the recess (11).

8. The galvanometer motor apparatus according to claim 6, further comprising two second through holes (12), wherein the two second through holes (12) are respectively molded on the front bearing seat (13) and the rear bearing seat (15).

9. The galvanometer motor apparatus according to claim 7, comprising two second through holes (12); wherein the two second through holes (12) are respectively molded on the front bearing seat (13) and the rear bearing seat (15).

10. The galvanometer motor apparatus according to claim 1, wherein one end of the axle (31) extends to the outside of the front end face of the housing (1) and is connected to a pre-arranged lens (4).

11. The galvanometer motor apparatus according to claim 1, further comprising a wiring board (5) arranged on a rear end face of the housing (1).

* * * * *